United States Patent [19]

Besenhard et al.

[11] Patent Number: 5,916,485
[45] Date of Patent: Jun. 29, 1999

[54] METHOD OF MANUFACTURING HIGHLY CONDUCTING COMPOSITES CONTAINING ONLY SMALL PROPORTIONS OF ELECTRON CONDUCTORS

[75] Inventors: Jürgen Otto Besenhard, Horstmar; Olaf Claussen, Münster; Heinrich Meyer, Berlin; Michael Kühlkamp, Ahaus, all of Germany

[73] Assignee: Atotech Deutschland GmbH, Berlin, Germany

[21] Appl. No.: 08/599,862

[22] Filed: Feb. 13, 1996

Related U.S. Application Data

[63] Continuation of application No. 08/244,794, filed as application No. PCT/DE92/00787, Sep. 11, 1992, abandoned.

[30] Foreign Application Priority Data

Dec. 11, 1991 [DE] Germany .......................... P 41 41 416

[51] Int. Cl.⁶ ................ H01B 1/02; H01B 1/04; B28B 11/06; B05D 1/36
[52] U.S. Cl. .......................... 252/511; 252/506; 252/512; 252/514; 264/131; 264/134; 427/202; 427/205; 427/214; 427/122; 427/123
[58] Field of Search ................ 252/506, 502, 252/503, 509, 510, 511, 512, 514, 521; 428/403, 404, 407; 427/214, 202, 205, 122, 123; 264/134, 131

[56] References Cited

U.S. PATENT DOCUMENTS

| | | | |
|---|---|---|---|
| 2,683,669 | 7/1954 | Coler | 106/193 |
| 3,956,194 | 5/1976 | Armand | 252/506 X |
| 3,958,057 | 5/1976 | Nishimura et al. | 428/216 |
| 3,978,378 | 8/1976 | Tigner et al. | 252/512 X |
| 4,090,984 | 5/1978 | Lin et al. | 252/511 |
| 4,233,191 | 11/1980 | Reutger et al. | 252/511 |
| 4,411,825 | 10/1983 | Domeniconi | 252/506 X |
| 4,478,883 | 10/1984 | Bupp et al. | 427/97 |
| 4,554,182 | 11/1985 | Bupp et al. | 427/304 |
| 4,566,991 | 1/1986 | Sibilia et al. | 252/512 |
| 4,655,964 | 4/1987 | Steinberger et al. | 252/511 |
| 4,874,477 | 10/1989 | Pendleton | 204/15 |
| 4,940,524 | 7/1990 | Perineau et al. | 428/402 X |
| 5,004,561 | 4/1991 | Nomura et al. | 252/511 |
| 5,028,481 | 7/1991 | Stramel | 428/407 X |
| 5,085,803 | 2/1992 | Wakita et al. | 252/511 |
| 5,183,552 | 2/1993 | Bressel et al. | 205/158 |

FOREIGN PATENT DOCUMENTS

| | | |
|---|---|---|
| 0 139 233 A1 | 5/1985 | European Pat. Off. |
| 0 400 544 A2 | 12/1990 | European Pat. Off. |
| 52-097190 | 8/1977 | Japan |
| 54-113641 | 9/1979 | Japan |
| 62-207875 | 9/1987 | Japan |
| 62-223255 | 10/1987 | Japan |
| 63-090502 | 4/1988 | Japan |
| 63-270869 | 11/1988 | Japan |
| 1045469 | 2/1989 | Japan |
| 1059872 | 2/1967 | United Kingdom |
| 1292224 | 10/1972 | United Kingdom |
| 91/10237 | 7/1991 | WIPO |

OTHER PUBLICATIONS

Derwent Database Translation of an Abstract of Japanese Application No. 87–295891, Patent No. JP62207875.
Derwent Database Translation of an Abstract of Japanese Application No. 77–69523Y, Patent No. JP52097190.
Derwent Database Translation of an Abstract of Japanese Application No. 89–065254, Patent No. JP1017404.
J. Electroanal. Chem. 292 (1990 53–62, Elsevier Sequoia S.A., Lausanne.
Journal of Power Sources, 5 (1980) 255–262.
Histriocal Highlights of Electroless Plating by Charles R. Shipley Jr., Jun., 1984.

*Primary Examiner*—Mark Kopec
*Attorney, Agent, or Firm*—Cohen, Pontani, Lieberman & Pavane

[57] ABSTRACT

The invention concerns a method of manufacturing highly conducting composites, the method being characterized by the following steps: a) contacting a powder or fibers with an aqueous solution containing an appreciably water-soluble high-molecular substance, b) optionally washing with water, c) contacting with a dispersion containing finely particulate electrically conducting material, wetting agents (surfactants) and an ionogenic metal compound, d) optionally washing with water and e) molding to required shape.

10 Claims, No Drawings

_ 
METHOD OF MANUFACTURING HIGHLY CONDUCTING COMPOSITES CONTAINING ONLY SMALL PROPORTIONS OF ELECTRON CONDUCTORS

This is a continuation of application Ser. No. 08/244,794, filed Aug. 10, 1994, now abandoned, which was filed as PCT/DE92/00787, Sep. 11, 1992.

BACKGROUND OF THE INVENTION

1. Field of the Invention

The invention is directed to a method for producing electrically conducting composites from predominantly nonconductive or only poorly conductive substances, in which the conductivity is achieved by the addition of unusually small proportions of highly conductive materials. A special feature of the composites according to the invention is the favorable spatial distribution of the added highly conductive materials which is achieved.

2. Discussion of the Prior Art

The production of conductive composites from predominantly nonconductive materials by adding conductive substances is attempted for many areas of application. These include conducting, and accordingly shielding, plastic housings for electronic devices or battery electrodes, for instance, which contain poorly conducting materials such as manganese dioxide as electrochemically active components.

There have been many studies concerned with the dependence of conductivity on composites containing conductive and nonconductive substances. The most important insight of these studies is that an increase in the conductivity of the composite is in no way proportional to the addition of electron-conducting components. Rather only after exceeding a threshold value of the proportion of conductive components, which is usually quite high, does the conductivity of the composite also increase (e.g., see K.-J. Euler, R. Kirchhof, H. Metzendorf, *J Power Sources,* 5 (1980) p. 255 and K. Aoki, *J. Electroanal. Chem.* 292 (1990), p. 53).

The reason for this effect is that substantial conductivity of the composite only occurs when the conducting component is so closely packed that there occur elongated "chains" or "networks" of conductive particles which provide for conductivity over great distances. Assuming uniformly shaped particles of the conductive and nonconductive component, the conductivity of mixtures of conductive and nonconductive particles can be calculated with the aid of the "percolation theory". Qualitatively speaking, the likelihood of the formation of elongated chains or networks of the conductive component is sufficiently high only with very high proportions of this component.

There are a number of methods within the prior art which basically enable a conductive coating of nonconductors. First, there are those methods which apply chiefly metal layers to nonconductors in vacuo by evaporation or sputtering (cathode sputtering). Numerous metals and other materials can also be deposited in thin layers on nonconductors by chemical vapor phase deposition (CVD).

However, these methods are poorly suited for coating powders, fibers and the like finely particulate materials, since it would be necessary to keep these finely particulate materials in constant motion in the gas phase or under vacuum in order to cover them on all sides. On the other hand, coating processes using solutions, e.g. the "electroless" metallization process (C. R. Shipley Jr., Plating and Surface Finishing, 71 (1984) 92) are considerably more manageable for coating large quantities of small particles. Deposition of copper, nickel, gold and silver is particularly successful with such electroless processes.

SUMMARY OF THE INVENTION

The object of the present invention is to provide a method by which to produce a composite material with high conductivity in the simplest manner through the application of substrate-induced coagulation by implanting very small amounts of conductive material.

This object is met by providing a method for producing electrically conducting composites from predominantly nonconductive or only poorly conductive substances, in which the conductivity is achieved by the addition of unusually small proportions of highly conductive materials. A special feature of the composites according to the invention is the favorable spatial distribution of the added highly conductive materials which is achieved in that particles of the nonconducting or poorly conductive substances are covered by highly disperse particles of the conductive materials before production of the composites. This is done by treating the nonconductive or poorly conductive particles with an aqueous solution of polymers and then with a dispersion of the highly conductive materials which is stabilized by surfactants and contains electrolytes.

The method for achieving substrate-induced coagulation requires that the bodies to be coated be immersed (a) in an aqueous solution of polymers and subsequently, or after a rinsing process, (b) in a dispersion of the particles to be used for coating which is stabilized with surfactants and contains electrolytes. It has been shown that carbon-coated nonconductors, for example, can then be coated by electrodeposition with optional metals in this way.

DETAILED DESCRIPTION OF THE PRESENTLY PREFERRED EMBODIMENTS

The principles and features of substrate-induced coagulation are summarized in the following, since this coagulation method is a preliminary stage in the production of highly conductive composites according to the invention. Further, the method of substrate-induced coagulation will be distinguished from conventional methods employing dispersions of coating materials. Within the framework of the present invention, the coating of nonconducting or poorly conducting components of composites with electron-conducting materials is generally carried out by means of substrate-induced coagulation.

The heretofore common methods of coating surfaces with particulate solids rely on two distinct principles of adhesion, namely a) embedment of the particles in a binder which causes adhesion to the surface of the substrate and b) adsorption of the particles on the surface of the substrate.

Embedment is the prevalent principle for application of high-viscosity dispersions containing binders, while adsorption is the essential principle of adhesion when using low-viscosity dispersions containing few, if any, binders. Insofar as the particulate solid matter is adsorbed only at the surface, the amount of adhering particles is small—generally only a more or less closed monolayer of particles is formed. Usually, only coatings having a brownish appearance and low electrical conductivity are achieved by adsorption on carbon particles.

Even when using adsorption-strengthening aids which reinforce the adsorptive forces, e.g., by means of opposite electrical charges or dipole/dipole and hydrophobe/ hydrophobe interaction, the thickness of the coating cannot exceed the limit of the monolayer in general, i.e. in the absence of multiple adsorption.

On the other hand, thick coatings can be achieved with substrate-induced coagulation. Substrate-induced coagulation is a method which leads not only to the adsorption of dispersed particles on substrate surfaces, but also to local coagulation exclusively at the substrate surface. For this purpose, however, the substrate surface must be covered by a substance which initiates coagulation. In comparison with simple adsorption, a much greater quantity of particles can be deposited on the surface in a purposeful manner by substrate-induced local coagulation.

The success of such substrate-induced local coagulation, which may naturally not progress to the volume of the dispersion, requires a series of steps which will first be described in general.

An essential factor in the success of the method is the balance between the two components: a) the coagulation initiator or trigger on the substrate and b) the dispersion capable of coagulation. Thus, this is a "two-component method" comprising two solutions, namely a pre-immersion solution containing the coagulation trigger and a dispersion of particulate solids in a low-viscosity liquid adapted thereto.

Of course, this dispersion must be conceived differently than conventional dispersions in which the coagulation—which is normally undesirable and often irreversible—is prevented when possible by generous use of stabilizers.

The dispersions used within the framework of substrate-induced coagulation are narrowly or "closely" stabilized and are brought to the coagulation point above all by metered addition of selected electrolytes. A sparing use of the stabilizer surfactants—which should preferably be anionically or cationically charged to achieve good results—is generally not sufficient to form dispersions which coagulate spontaneously in contact with a suitable destabilizing substance.

The selection of surface-active stabilizers for impeding flocculation of the particles of solid matter is not particularly critical to the function of the substrate-induced coagulation. Virtually all known types of stabilizers are suitable in principle so that compatibility with the particles of solid matter to be stabilized may be used as a criterion.

Similarly, there are many possibilities for selecting the ionic metallic compound (electrolyte) to be added for partial destabilization of the dispersions. Good results have been achieved with KCl and $NH_4NO_3$, but $CaCl_2$ or $K_2SO_4$ are also perfectly suitable, these rather randomly selected examples being in no way intended as limiting.

The electrolyte additions are in typical concentrations of 0.05 mol/l, although higher or lower concentrations may be advisable depending on the stabilizer which is used.

The most appropriate solvent for these dispersions is water. However, other polar solvents (e.g., alcohols or ketones) may be used either as additions to the water or by themselves, for example, when difficulties related to wetting arise with respect to the substrate.

The selection of finely particulate solids which can be deposited on surfaces according to the principle of substrate-induced coagulation is not limited fundamentally. In addition to different carbon materials, finely particulate oxides such as silicic acid ($SiO_2$), tungsten blue ($H_xWO_3$) or layer compounds such as $MoS_2$ can also be coagulated in a substrate-induced manner, but these examples should not be understood as limiting.

To prevent coagulation exclusively or predominantly in the volume of the dispersion resulting in destruction of the latter, the substance triggering the coagulation must remain adherent to the surface of the substrate. This can be achieved in particular by means of polymeric coagulation triggers which can be detached from the surface at least only very gradually so that the coagulation taking effect overtakes a possible detaching process.

Moreover, such macromolecules generally cover far less surface area than would be expected based on dimensions. Rather, substantial proportions of the molecules extend into the interior of the solution in the form of "streamers" or "tentacles" so that their effective range is radically increased compared with small molecules having otherwise similar properties.

A large number of water-soluble polymers have been shown to be suitable for a coagulation-triggering pretreatment of substrates for substrate-induced coagulation, where the presence or direction of a charge evidently does not play a decisive role. Good results have been achieved with all types of gelatins as well as polyacrylates carrying a certain number of ammonium groups to improve their solubility (e.g., Basoplast types available from BASF) Other water-soluble peptides such as albumins are also suitable.

In addition to the aforementioned high-molecular substances, which generally carry a low cationic charge density, numerous other cationically charged polyelectrolytes are well suited as coagulation triggers, e.g. copolymers of acrylamides or methacrylamides with salts or quaternary products of aminoacrylates or other polyelectrolytes carrying simple or substituted ammonium groups. Numerous compounds of this kind are available as "flocculents" with trade names such as Superfloc (American Cyanamid), Etadurin (Akzo), Sedipur (BASF), Magnafloc (Allied Colloids), Nalcolyte (Nalco), Sanfloc (Sanyo) or Separan (Dow Chemical).

Surprisingly, it has been found that the cationic polyelectrolytes with relatively low charge density (less than 0.5 meq/g) are better coagulation triggers than those with higher charge densities. This indicates that the adhesion between the "cationic surface" and anionically stabilized particulate solids is not due simply to the electrostatic interaction between them.

However, it is certainly not the case that only cationically charged high-molecular substances are suitable as coagulation triggers. Results comparable to those achieved by cationic polyelectrolytes may be obtained with a range of uncharged water-soluble macromolecules such as polyacrylamides, polyvinylpyrrolidones or polyvinyl alcohols (e.g. Mowiol types manufactured by Hoechst) with a sufficiently high average molecular mass of preferably greater than 10,000 U). Other examples of suitable uncharged macromolecules are polyethylene glycols and polyethylene glycol ether, epichlorohydrin-imidazole addition compounds, polyvinyl imidazoles as well as polysaccharides such as agar-agar, starch, pectin or dextran and sugar polymers such as alginic acid.

Finally, a coagulation-triggering effect can also be achieved with anionically charged high-molecular substances. Examples of the latter are the sodium salt of carboxymethyl cellulose or the sodium salt of "alginic acid", a copolymer of mannuronic acid and glucuronic acid. Other suitable anionically charged high-molecular substances are alkali salts of polycarboxylic acids such as polyacrylic acid or other acids such as polyvinyl phosphoric acid.

The fact that coagulation can be brought about, for example, with cationic coagulation triggers such as gelatin with a pH of around 3.2 in combination with cationically stabilized particulate solids proves that the effect of substrate-induced coagulation is not to be explained simply by trivial electrostatic attraction of opposite particles. Similarly, anionically stabilized particulate solids can also be coagulated on substrates with anionic coagulation triggers such as alginate or carboxymethyl cellulose sodium salt.

In view of this, it is also not surprising that anionically and cationically stabilized particulate solids can be coagulated on substrates by coagulation triggers with neutral charges.

Accordingly, the method of substrate-induced coagulation is not very discriminating with respect to the characteristics of the material to be coated, i.e. practically any materials can be coated in this way. In fact, the material of the substrate does not play a decisive role chemically in the coagulation process. The only condition to be satisfied for the success of the process is a sufficient covering of the surface of the substrate with a coagulation trigger.

This precondition can be met by water-soluble polymers on practically all substrates. Even hydrophobic and lipophobic PTFE (TEFLON) after immersion in aqueous solutions of the coagulation trigger gelatin—even after subsequent rinsing with water—still retains on its surface sufficient amounts of the coagulation-triggering substance so as to be coated with a dense carbon black layer when immersed in carbon black dispersions according to the invention.

Other plastics, whether polar plastics such as epoxy resins, polyamides, polyimides, phenolic resins, ABS plastic or nonpolar plastics such as polyethylene and polypropylene, can be coated with particulate solids in the same way as metals or glass and ceramics.

If a region-selective coating is desired, this can be achieved already during immersion in the polymeric solution by means of suitable masking. The regions which were covered during this immersion step are not covered by coagulated particles during the second immersion step. In certain cases, it is also possible to achieve substrate-selective coatings. However, this can only be realized by secondary treatment due to the low substrate specificity of the coagulation method.

The sequence of individual steps taking place in substrate-induced coagulation are not yet fully understood and their general validity has not yet been tested. Based on the current level of understanding, water-soluble (and accordingly polar) polymers on the surface of the substrates to be coated with particulate solids cause the stabilizers found in the dispersion (surface-active substances which hydrophilize the particulate solids and accordingly render these particles "floatable") to be partially detached from the particles and to interact directly with the polymers. Accordingly, the particulate solids located particularly close to the surface of the substrate lose their "floatability" and coagulate on this surface.

It is surprising and noteworthy that the mechanism of substrate-induced coagulation underlying the present invention is not to be considered as a trivial interaction between opposite charges on the surface of the substrate (caused, for example, by an adsorbed polymer carrying positive charges) and on the particulate solids (caused, for example, by an anionic surfactant carrying negative charges).

Numerous examples confirm that substrate-induced coagulation can also take place when the surface of the substrate and the suspended particles are charged in the same direction or have practically no charge.

In fact, the effect of substrate-induced coagulation can be observed in principle—although not always will good results—with virtually any combination of substrate coatings (cationic, anionic and neutral polymers) and stabilizers for the suspended particles (cationic, anionic and amphoteric surfactants). In particular, charged surfactants have proven more successful than uncharged surfactants for stabilizing particle dispersions.

Further evidence of the limited importance of the charge of the polymers adsorbed on the substrates consists in that in a combination of cationic polymers (polyelectrolytes based on acrylamide) and carbon black dispersions (Furnace black Printex L.6, Degussa) stabilized with anions (Aerosol OT, Cyanamid), e.g., on epoxide surfaces, higher carbon black coatings are found with decreasing charge densities of the cationic polymers.

A decisive advantage of high-molecular coagulation triggers compared with low-molecular coagulation triggers is their improved adhesion on the surface of the substrate, which is purely statistical by reason of the large number of possible coordination points.

Further, high-molecular substances adsorbed on surfaces extend far into the solution with "streamers" and "tentacles" so that their effect is not limited only to the immediate surface.

A substantial component of the "closely" stabilized dispersions suitable for substrate-induced coagulation is their electrolyte content. As the electrolyte content increases, the stability of colloidal dispersions decreases until a critical coagulation concentration is finally reached. (J. Gregory, *Material Science Forum*, 25/26 (1988) p. 125). Suitable concentrations of electrolytes for the "close" adjustment of the dispersions must be empirically determined, whereas the selection of electrolytes is not particularly critical. It is important that the dispersion be brought near enough to the flocculation limit while still ensuring sufficient stability.

It is particularly surprising that a technically reliable and favorably controllable method can be carried out with dispersions which are deliberately brought close to their coagulation limit by addition of electrolytes. However, the stability windows can readily be adjusted in practice such that the electrolyte-containing dispersions can still be preserved on the one hand, while spontaneous coagulation is effected in contact with the coagulation triggers on the other hand.

As has already been stated above, substantially thicker layers of particulate solids can be deposited with the method of substrate-induced coagulation compared with methods relying simply on adsorption.

Concomitantly, there is a higher conductivity of coatings of electron-conducting particles, for example. Further, the method of substrate-induced coagulation, according to the invention, can be applied to all surfaces, e.g. both polar and nonpolar plastics (such as polypropylene or TEFLON) and also to metals or glasses.

It remains to be noted that the process of substrate-induced coagulation is generally irreversible and consequently, once the particles have been deposited, they adhere sufficiently so as to withstand a rinsing process directly following thereupon. Such rinsing processes are indispensable in industrial applications to prevent the carryover of chemicals from one bath into the next.

A further advantage of the resistance of layers of particulate solids to rinsing related to the irreversible coagulation consists in that the process can be repeated with the object of forming especially thick layers. For example, successive thick layers of carbon black can be formed on the substrates by a solution bath sequence A-B-C-B-A-B-C-B-A-B-C . . . , where A=pre-immersion solution with gelatin, B=rinse water, and C=dispersion of cationically stabilized carbon black with added KCl).

Another distinguishing feature of the process of substrate-induced coagulation consists in that it works with substances entailing no environmental or heath risks. The polymeric coagulation triggers are, for the most part, literally edible and are widely used in the foodstuffs industry (e.g., gelatin and carboxymethyl cellulose). The harmlessness of the surface-active stabilizers for the finely particulate materials has also been demonstrated in most cases by years of problem-free use (e.g. in cosmetic body lotions). Moreover, the process makes do without organic solvents.

In the production of conductive composites from predominantly nonmetallic materials, it is attempted to make do with the smallest possible amounts of conductive additions, since these interfere with the desired characteristics of the nonconducting or poorly conducting material. In plastics, for example, impact resistance is lowered by adding conductive carbon blacks. In battery electrodes, such additions which necessarily reduce the proportion of electrochemically active components lower the energy density.

A distribution of conductive components in composites which is particularly advantageous for achieving higher conductivity is achieved by coating the nonconducting particles with a thin layer of conducting material and then processing them to produce formed bodies, e.g., by sintering, compression or gluing. However, the technical conversion of this principle poses problems, since this requires an efficient method for conductive coating of large quantities of small particles of nonconducting substances.

The highly conductive composites according to the invention are produced from nonconducting or poorly conducting particles which are covered with a coating of highly disperse, conducting solids by using the method of substrate-induced coagulation.

There are various options within this method. In certain cases, particularly with fibrous nonconductors and woven or nonwoven textile-type products manufactured therefrom, the subsequent compacting process (pressing, sintering or gluing) can be dispensed with. Moreover, the surface conductivity produced by the substrate-induced coagulation of conducting particles can be used for applying additional conducting coats by electroplating processes. Electrochemical "fluid bed reactors" which allow electrochemical reactions on small conducting particles are particularly suitable for this purpose.

Finally, the option of repeated coating by means of substrate-induced coagulation can be used not only to produce particularly thick coatings, but also—by varying the dispersion solution—for "mixed" coatings.

Naturally, the conductively coated particles of thermoplastic materials required for producing highly conductive composites can also be produced in principle by other coating methods. One possibility, although a relatively expensive alternative, is electroless metallization which was mentioned above.

The drastic advantage in the use of conductively covered thermoplastic particles as a starting product for the manufacture of composites is demonstrated by embodiment examples (1) and (2) in which the conductivity of composites having a practically identical content of electron-conducting substances, but produced by different methods, is compared. The composites according to the invention can have a variety of applications. For example, polypropylene powder covered by carbon can be processed as electrically conducting molded articles such as housings for electronic devices. Materials having the mechanical properties of plastics with simultaneously higher electronic conductivity can also be used in a variety of ways in electrochemical reactors, e.g. for manufacturing the support mesh and bypass grid for large battery electrodes. This has the particular advantage that the forming process is much simpler compared to metals.

Carbon-coated polypropylene powder or PTFE powder is an excellent conducting binder for the manufacture of battery electrodes containing, e.g., manganese dioxide powder or other finely particulate brittle solids. Particularly good results are obtained by coating the particles of the brittle solid with highly disperse electron conductors using the principle of substrate-induced coagulation.

EXAMPLES

The following examples serve to define the invention more fully without any intention of being limited thereby.

Example 1

Polypropylene powder for chromatography (catalog no. 4342) manufactured by Polysciences, Inc., Warrington, with an average particle diameter of approximately 35 $\mu$m is used. This powder is prepared by treating with the pre-immersion solution Neoganth® B available from Schering Galvanotechnik. The solution is prepared and handled according to the instructions for use; however, the application time is increased to 5 minutes. The preparation should contain 10 g of powder per liter of solution and be intensively stirred. The polypropylene powder is then collected by suction filtration in a suitable filter crucible and used immediately without rinsing or storage.

The pretreated powder is now treated with the activator solution Neoganth® available from Schering Galvanotechnik. The solution is prepared and handled according to the instructions for use; however, the treatment time is increased to 15 minutes. Suction filtration is carried out in a suitable filter crucible and a slurry is made from the powder in distilled water followed by suction filtration. This slurry is repeated one time. The material treated in this way is reduced immediately without storage. The preparation amount and agitation are carried out in the same way as indicated for the pre-immersion solution.

The powder charged with the activator is reduced with a solution comprising 4 g of sodium hydroxide and 1 g of sodium borohydride per liter of distilled water. A fresh solution is prepared in each instance. The bath temperature is 20 to 25° C. and the treatment period is 6 minutes. Suction filtration is then carried out in an appropriate filter crucible and a slurry is made in distilled water. After standing for a short time, the polypropylene powder floating to the surface is removed with a ladle. The activated polypropylene powder is coppered in a chemical copper bath of Noviganth® HC sold by Schering Gavanotechnik. Preparation and handling of the bath is carried out according to the directions for use. The coppering is effected with a preparation comprising instructions for the bath, the bath parameters with respect to the copper are not controlled. The desired proportion of copper on the powder is achieved by interrupting the test at intervals determined in prior tests or by continuous analysis of samples during the coppering process. The coppered powder is then collected by suction filtration on a filter crucible and slurried in distilled water to eliminate bath residues and suction filtration is then carried out again. The cleaning process is repeated one time. The powder is then dried in a vacuum unit. The powder can now either be used immediately or stored in an argon atmosphere.

The coppered powder is now processed to form molded articles—in this case pellets for further measurement. This is carried out in a suitable compression molding die. For this purpose, the desired amount of powder is placed in the die. The powder is then pressed gradually in a stepwise manner during 30 minutes until the maximum tolerated pressure for the die is reached (at least 2 to/cm$^2$). This pressure is maintained for another 30 minutes. The specific compression times relate only to the employed compression molding die and may be drastically reduced, in particular when using vacuum forming tools.

The molded polypropylene powder, together with the molding tool with locked die, is transferred to an oven which is preheated to 210° C. and is removed after 30 minutes. After cooling to room temperature, the solid pellet may be removed.

The end faces of this pellet are then polished so as to remove any surface oxides and its surfaces are provided with conducting silver. After the conducting silver is dry, the resistance of the pellet is measured. The specific resistance can be calculated from the geometric data of the pellet and from its measured resistance. The specific resistance amounts to 5Ω·cm for a pellet produced from electroless coppered polypropylene powder with a copper content of 24 percent by weight.

For purposes of comparison, pellets are also produced from the polypropylene powder mentioned above and copper powder available from W. C. Heraeus GmbH, Hanau (Type 000-05, Ch. 883031). Exactly weighed-in amounts of copper powder and polypropylene powder are mixed until completely homogeneous by stirring and comminution in a mortar. This is carried out in an argon atmosphere to prevent oxidation of the copper powder. Further processing is effected corresponding to the electroless coppered polypropylene powder.

Specific resistance: >50 MΩ·cm (27 percent by weight copper), >50 MΩ·cm (33 percent by weight copper), >50 MΩ·cm (39 percent by weight copper), 176 kΩ·cm (48 percent by weight copper).

Example 2

As in Example 1, activated polypropylene powder is coppered in a chemical copper bath of Noviganth® HC sold by Schering Galvanotechnik. Preparation and handling of the bath is carried out according to the directions for use. The coppering is effected with a preparation comprising 2 g of powder per liter copper bath using argon as protective gas. Contrary to the operating instructions for the bath, the bath parameters with respect to the copper are not controlled. The desired proportion of copper on the powder is achieved by interrupting the test at intervals determined in prior tests or by continuous analysis of samples during the coppering process. The coppered powder is then collected by suction filtration on a filter crucible and slurried in distilled water to eliminate bath residues and suction filtration is then carried out again. This cleaning process is repeated one time. The powder is then dried in a vacuum unit. The powder can now either be used immediately or stored in an argon atmosphere.

The coppered powder is now processed as molded articles—in this case as pellets for further measurement. This is carried out in a suitable compression molding die. For this purpose, the desired amount of powder is placed in the die. The powder is then pressed gradually and in a stepwise manner during 30 minutes until the maximum tolerated pressure for the die is reached (at least 2 to/cm$^2$). This pressure is maintained for another 20 minutes. The specific compression times relate only to the employed compression molding die and may be drastically reduced, in particular when using vacuum forming tools.

The molded polypropylene powder, together with the molding tool with locked die, is transferred to an oven which is preheated to 210° C. and is removed after 30 minutes. After cooling to room temperature, the solid pellet may be removed.

The end faces of this pellet are then polished so as to remove any surface oxides and its surfaces are provided with conducting silver. After the conducting silver is dry, the resistance of the pellet is measured. The specific resistance can be calculated from the geometric data of the pellet and from its measured resistance. The specific resistance amounts to 5Ω·cm for a pellet produced from electroless coppered polypropylene powder with a copper content of 24 percent by weight.

For purposes of comparison, pellets are also produced from the polypropylene powder mentioned above and copper powder available from W. C. Heraeus GmbH, Hansu (Type 000-05, Ch. 883031). Exactly weighed-in amounts of copper powder and polypropylene powder are mixed until completely homogeneous by stirring and comminution in a mortar. This is carried out in an argon atmosphere to prevent oxidation of the copper powder. Further processing is effected corresponding to the electroless coppered polypropylene powder.

Specific resistance: >50 MΩ·cm (27 percent by weight copper), >50 MΩ·cm (33 percent by weight copper), >50 MΩ·cm (39 percent by weight copper), 176 kΩ·cm (48 percent by weight copper).

Example 3

Teflon® powder with an average particle diameter of approximately 300 μm is used (Roth; catalog no. 5603.1). In the following, this powder is conductively coated with carbon (carbon black Printex® L6; Degussa). The carbon black dispersion used in this case has the following composition:
surfactant: 3.2×10$^{-3}$ hexadecyltrimethylammonium bromide (Aldrich; catalog no. 85,582-0)
electrolyte: 0.05M KCl
carbon black: 1% Printex® L6
Deionized water is used as solvent.

To produce the dispersion, the surfactant is first dissolved by adding an equal amount by weight of ethanol and is placed in water. The carbon black is then stirred in and dispersed for 15 minutes by ultrasonic technique. The electrolyte is then added in the form of a 1-mole solution while stirring. The dispersion is filled until reaching the final volume and is treated by ultrasonic technique for a further 5 minutes. It is necessary to repeat the ultrasonic dispersion after one or two days during use.

A 0.2-percent aqueous gelatin solution is also used. To produce the solution, the gelatin (average gel strength; Fluka; catalog no. 48722) is first dissolved after 10 minutes swelling time at 60° C. and is then stored for 5 hours at 7° C. and subsequently heated to 20° C.

The following samples will show that the use of gelatin in coating Teflon® powder with carbon black leads to a reinforced deposition.

Sample 1: For better handling of the hydrophobic Teflon® powder in the aqueous carbon black dispersion it is first wetted with a surfactant. For this purpose, the powder is agitated (at room temperature) for 2 minutes in a 1-percent surfactant solution (Aerosol® OT-100, Cyanamid, catalog. no. 16253). The wetted Teflon® is then collected by suction filtration, slurried in water repeatedly for cleaning purposes, and then collected again by suction filtration. The material treated in this way is then added to a 0.2-percent aqueous gelatin solution (at 20° C.) while stirring for 2 minutes. The Teflon® powder is then slurried again and suction filtration is effected. In the next step, the powder is added to the carbon black dispersion while stirring during 5 minutes (at 30° C.). The coated powder is then dried for 1 hour at 120° C.

Sample 2: In contrast to Sample 1, the work step with the gelatin solution is not carried out. The rest of the process steps are carried out as in Sample 1.

Sample 3: In this sample, the Teflon® is treated with a mixture of Aersosol® solution (1-percent concentration) and gelatin solution (0.2-percent concentration) in a ratio of 1:1 while stirring (10 minutes at room temperature). Suction filtration is then carried out and a slurry is made with water several times and then suction filtration is effected again. The powder is then added to the carbon black dispersion while stirring during 1 hour (at 30° C.). Suction filtration is carried out again, followed by a slurry and again by suction filtration. The Teflon® is then dried for 1 hour at 120° C.

Sample 4: In contrast to Sample 3, gelatin is not used. The Teflon® powder is first wetted with the 1-percent Aerosol® solution (10 minutes at room temperature). Then suction filtration is carried out, several slurries are prepared with water and suction filtration is carried out again. The subsequent coating with carbon black and the drying process are carried out as in Sample 3.

In order to test the carbon black coating of the Teflon® powder, a pellet is made from each sample by molding at a pressure of 20 kp/cm². Conducting silver is then applied to the end faces of these pellets. The specific resistance can now be calculated from the geometrical data of the pellets and the measured resistance: Sample 1=370Ω·cm, Sample 2=780Ω·cm, Sample 3=84Ω·cm, and Sample 4=414Ω·cm.

Example 4

This example shows that better results can be achieved with a multiple coating.

Sample 5: In this sample, the Teflon® powder is first wetted (see Sample 1). Suction filtration is then carried out, followed by repeated slurries with water and again by suction filtration. The subsequent work steps (treatment with gelatin, cleaning by preparation of slurries, and coating with carbon black) are identical to those in Sample 1. In contrast to 1, however, no drying is carried out. Rather, the work steps mentioned above (gelatin, cleaning and carbon black) are repeated twice in each instance. Only then is drying carried out, as in Sample 1, after preparation of a new slurry and suction filtration.

To test the quality of the coating of the Teflon® powder with carbon black, the sample is processed as a pellet (compare Example 1). Resistance of Sample 5: 31Ω·cm.

We claim:

1. A method of producing a highly conductive composite from a substrate selected from the group consisting of powders and fibers of finely particulate starting materials, consisting essentially of the following steps:

(a) treating the substrate with an aqueous solution containing at least one watersoluble high-molecule weight polymer which is a coagulation inhibitor; thereafter (b) treating the aqueous solution-treated substrate with a dispersion which is capable of coagulation and which contains conductive finely particulate solids, at least one wetting agent, and an ionic compound to form a conductive particle layer by coagulation on the surface of said substrate; and (c) compacting the substrate, treated according to steps a) and b) to form the composite.

2. The method of claim 1, wherein the substrate is rinsed after step (a).

3. The method of claim 1, wherein the substrate is rinsed after step (b).

4. The method of claim 1, wherein the conductive particles are compacted by a step selected from the group of steps consisting of (a) compression molding the conductive particles, (b) sintering the conductive particles and (c) adding a member of the group consisting of adhesives and plastic binders to the conductive particles, and combinations of the molding, sintering and addition steps.

5. The method of claim 1, wherein the conductive particles are at least partially thermoplastic.

6. The method of claim 1, wherein the conductive particulate solids are made from a member selected from the group consisting of graphite, carbon black, and combinations thereof.

7. The method of claim 1, wherein the wetting agent is selected from the group consisting of anionic surfactant, cationic surfactant, amphoteric surfactant and non-ionic surfactant.

8. The method of claim 1, wherein the ionic compound is selected from the group consisting of fluorides, chlorides, bromides and iodides of lithium, sodium, potassium, magnesium, calcium, barium, strontium, ammonium and copper.

9. The method of claim 1, wherein the water-soluble polymer has a molecular mass greater than 10,000 U.

10. The method of claim 1, wherein the compositing is done by compression molding.

* * * * *